US006345073B1

(12) United States Patent
Curry et al.

(10) Patent No.: US 6,345,073 B1
(45) Date of Patent: Feb. 5, 2002

(54) CONVOLUTIONAL DESPREADING METHOD FOR RAPID CODE PHASE DETERMINATION OF CHIPPING CODES OF SPREAD SPECTRUM SYSTEMS

(75) Inventors: Samuel J. Curry, Redondo Beach; David M. Schwartz, Chatsworth; John F. Collins, Rancho Palos Verdes, all of CA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 09/168,642

(22) Filed: Oct. 8, 1998

(51) Int. Cl.[7] .............................. H04L 5/12; H04L 23/02
(52) U.S. Cl. ..................... 375/265; 375/134; 375/136; 375/137; 375/145; 375/147; 375/149
(58) Field of Search ................................. 375/265, 262, 375/263, 134, 136, 137, 145, 147, 149, 341, 349; 714/700, 792, 794, 796, 814

(56) References Cited

U.S. PATENT DOCUMENTS

| 4,807,256 A | * | 2/1989 | Holmes et al. ................ 375/97 |
| 5,103,459 A | | 4/1992 | Klein et al. |
| 5,914,943 A | * | 6/1999 | Higuchi et al. ............. 370/320 |
| 6,195,041 B1 | * | 2/2001 | Gardner et al. ......... 342/357.12 |

OTHER PUBLICATIONS

"A Technique for Rapid Acquisition of Direct Sequence Spread Spectrum Signals", Chauncey S. Miller, IEEE Aerospace Conf., vol. 1, p. 83, Feb. 1, 1997.

"Digital Communications", Bernard Sklar, Chapter 2, Channel Coding 314–380, Chapter 10, Spread Spectrum Technique, pp. 536–594, Prentice Hall.

"Principles of Communication Engineering", John M. Wozencraft and Irwin M. jacobs, pp. 426–439, 1965, John Wiley and Sons.

* cited by examiner

Primary Examiner—Mohammad H. Ghayour
(74) Attorney, Agent, or Firm—Derrick Michael Reid

(57) ABSTRACT

A convolutional despreading method takes advantage of the algebraic structure of the spreading code and applies convolutional type decoding to received signal chip symbols to rapidly estimate code phase, preferably used for rapid acquisition of direct sequence spread spectrum signals. Modeled reduced-state structures having branchword transitions are used to reduce metric computations. The reduced state structures and algebraic structures provide additive constraints for modifying convolutional sequential metric searching for improved speed of code phase determination. The convolution despreading method preferably uses a modified convolutional sequential search algorithm, such as, a modified Fano Tree convolutional sequential search, or, a modified Viterbi trellis convolutional sequential search. The method can also directly determine a modulated data stream, when present, to provide demodulated data without necessarily performing conventional cross correlation despreading. A metric state processors then functions as an ad hoc despreader. The convolutional despreading method is particularly useful in direct sequence spread spectrum systems where the use of chip spreading codes requires code phase determination for rapid acquisition of direct sequence spread spectrum signals.

16 Claims, 8 Drawing Sheets

5 STAGE RAPID ACQUISITION DSSS SYSTEM

5 STAGE CHANNEL BASEBAND DSSS SIGNAL

5 STAGE RAPID ACQUISITION DSSS SYSTEM

TRANSMITTED BRANCH WORD DIAGRAM
FOR THE 5-STAGE DSSS SYSTEM

5 STAGE DSSS SYSTEM STATE {0,0,0,} TREE DIAGRAM

5 STAGE DSSS SYSTEM REDUCED STATE DIAGRAM WHEN D=0

5 STAGE DSSS SYSTEM REDUCED STATE DIAGRAM WHEN D=1

4 STAGE CHANNEL BASEBAND DSSS SIGNAL

RAPID ACQUISITION DSSS SYSTEM

4 STAGE DSSS SYSTEM REDUCED STATE DIAGRAM WHEN D = 0

4 STAGE DSSS SYSTEM REDUCED STATE DIAGRAM WHEN D = 1

4 STAGE DSSS SYSTEM TRELLIS DIAGRAM

4-STAGE DSSS SYSTEM TRELLIS DIAGRAM

|  | S1 | S2 |  |  | S3 |  |
|---|---|---|---|---|---|---|
|  | 1 | 1 | - | - | 0 | ← CURRENT STATE |
|  | X1 | 1 | 1 | - | - |  |
|  | X2 | X1 | 1 | 1 | - |  |
| $X2 = \overline{X3}$ → | X3 | X2 | X1 | 1 | 1 |  |
| $X4 = \overline{X3}$ → | X4 | X3 | X2 | X1 | 1 | ← NEXT STATE |

TRANSMITTED BRANCH WORD DIAGRAM FOR THE
4-STAGE DSSS SYSTEM

FIG. 10A

|  |  | S1 | S2 |  |  | S3 |  |
|---|---|---|---|---|---|---|---|
|  |  | 0 | 0 | - | - | 0 | ← PREVIOUS STATE |
| REQUIRED BRANCH WORD | ↑ | W1 | 0 | 0 | - | - |  |
|  |  | 1 | W1 | 0 | 0 | - |  |
|  |  | 1 | 1 | W1 | 0 | 0 |  |
|  | ↓ | 1 | 1 | 1 | W1 | 0 | ← CURRENT STATE |
| $X1 = X+1 = \overline{X}$ → |  | X1 | 1 | 1 | 1 | W1 |  |

TRANSMITTED BRANCH WORD CONSTRAINT DIAGRAM
FOR THE 4-STAGE DSSS SYSTEM

FIG. 10B

CONVOLUTIONAL DESPREADING METHOD FOR RAPID CODE PHASE DETERMINATION OF CHIPPING CODES OF SPREAD SPECTRUM SYSTEMS

STATEMENT OF GOVERNMENT INTEREST

The invention was made with Government support under Contract No. F04701-93-C-0094 by the Department of the Air Force. The Government has certain rights in the invention.

FIELD OF THE INVENTION

The invention relates to the field of Communication systems and more particularly to Direct Sequence Spread Spectrum communication systems.

BACKGROUND OF THE INVENTION

Direct Sequence Spread Spectrum (DSSS) is a commonly used method for protecting communication and navigation signals against both jamming and unintentional interference, and for providing code division multiple access (CDMA), in which multiple DSSS signals may share the same bandwidth. DSSS signals are widely used to provide protection against narrowband interference and reduce multipath signals within predetermined bandwidths. Spread spectrum systems provide signal security, frequency management, and jamming and noise immunity.

A DSSS signal includes a pseudo-random sequence, that is, a direct sequence, spreading code modulated by a data stream. A CDMA channel bandwidth may be used for transmitting a plurality of superimposed DSSS signals each comprising a respective unique data stream modulating a respective unique spreading code signal. The DSSS modulation requires the generation of a pseudo-random sequence of chips, that is, spreading code bits of zeros and ones, as the spreading code. The chips are communicated as digital symbols. There is a predetermined number of chips per each data bit, with the data bits and code chips combined in synchronism. A remote transmitter code generator generates the spreading code at a chipping rate typically much higher than the data bit rate of the data stream so that the direct sequence spreading code can be modulated by the lower bit rate of the digital data stream so as to spread the bandwidth of the data stream by the chipping rate over CDMA bandwidth. The modulation of the spreading code by the data stream effectively spreads bandwidth of the data stream over the CDMA bandwidth. The symbol or chipping rate of the spreading code must be higher than the data rate of the underlying data stream, for example, ten thousand times faster, for spectrum spreading with high processing gain equal in dB to ten times the log of the ratio of the bandwidth of the chipping rate divided to the bandwidth of data modulated by the chips. The digital chips of the spreading code are added modulo two to the respective underlying data stream. The resulting sequence of chips has a symbol rate equal to the chipping rate of the spreading code. The spreading code is used to spread the data stream bandwidth. Several DSSS signals have respective unique spreading codes that are typically transmitted by superposition within the CDMA bandwidth communicating the plurality of DSSS signals.

The spreading codes are chosen so that the cross correlation between different codes, of respective DSSS signals, is low. Low cross correlation between different spreading codes ensures that the correlation process upon reception will isolate only the DSSS signal and the data bit stream of interest that corresponds to the selected spreading code while rejecting the other DSSS signals that share the CDMA bandwidth. Typically, the spreading codes are linear recursive sequences in which each chip is the modulo two sum of a fixed set of preceding chips. Sequences of this type are usually generated as the output of a linear feed back shift register. The register is tapped at the locations corresponding to the chips that are to be summed and the modulo two sum is fed back into the first stage of the shift register. To begin the process, a vector must be loaded into the shift register. The vector must be a non-zero vector to avoid a constant zero sequence. This vector is referred to as the initial fill word or initial state. For DSSS applications, it is desirable that the sequences be pseudo-random and long. Only certain choices of taps in the shift register produce sequences of desirable cross correlation properties and maximum length. The shift register taps correspond to the non-zero coefficients of a generating polynomial function for the DSSS code sequence. An identical polynomial function may be implemented using the same shift register feedback structure in the receiver to locally generate the same code sequence for despreading with the same initial fill word.

Upon reception, the spreading code is used to despread the CDMA channel to isolate and acquire the particular DSSS signal of interest and to then recover the underlying digital data of the digital data stream. The DSSS signal has a bandwidth larger than the digital bit stream by virtue of modulating the data stream at the higher chipping rate, that is, at the frequency of the spreading code. The spreading code is generated at a higher frequency and is modulated by the digital data bit stream having a lower frequency, and hence the digital data bit stream is spread from a narrow data rate bandwidth across the larger bandwidth defined by the higher chipping rate, that is, the symbol rate.

The receiver of a DSSS signal requires the generation of the same spreading code for correlation detection of the respective particular modulated data stream of interest. The receiver typically locally generates the same spreading code. The data stream is recovered from the DSSS signal by correlating the locally generated replica of the spreading code with the received DSSS signal. The correlation process removes the spreading code by despreading the DSSS signal back into the underlying data stream and increases the strength of the received signal by a factor equal to the processing gain equal to the bandwidth of the DSSS signal divided by the bandwidth of the underlying data stream. The DSSS bandwidth is thereby effectively compressed back into the bandwidth of the underlying data stream.

In practice, a DSSS signal or a plurality of DSSS signals may further modulate a high frequency carrier signal suitable for radio frequency transmission. There are many types of carrier modulation methods used, such as Binary Phase Shifted Keyed, (BPSK), Quadrature Phase Shift Keyed (QPSK) and Gaussian Minimum Shift Keyed (GMSK) carrier modulation methods. Further still, the data bits of the data stream may be formatted before producing a modulated data stream. There are many types of data stream data modulation methods, such as, non-return to zero (NRZ), and Manchester (Bi-Phase-L) data stream modulation methods. Upon reception, the carrier signal is typically demodulated using tracking, Costas loop or squaring loop carrier demodulators, to produce the digital stream. The data of the data stream is then demodulated using data bit synchronizers to detect data bits at the data rate to recover the data bits from the data stream. Carrier modulation and data stream modulation during transmission, and, carrier demodulation and data stream demodulation during reception typically occur in addition to the spreading and despreading of the DSSS signal over the CDMA bandwidth. Carrier and data stream modulation and demodulation are well known to those skilled in the art of spread spectrum systems.

A DSSS signal is received by a DSSS receiver that recovers the data of the spread spectrum data stream. The DSSS receiver must not only generate a replica of the chip sequence of the spreading code for DSSS despreading, but must also time shift the locally generated replica to be aligned in time with the remotely generated spreading code in the received DSSS signal to within a fraction of a chip interval so that the correlation produces a despread signal. The time shift between the locally generated spreading code and the remotely received spreading code in the received DSSS signal is related to a specific number of chips in the spreading code at the chipping rate. Hence, the time shift offset between the received spreading code and the replica despreading code establishes a code phase. Determining this time shift code phase for correlation alignment is necessary to recover the data stream and is known as code phase acquisition, or more simply code acquisition. When the locally generated despreading code is in time alignment, then the despreading correlation will isolate only that DSSS signal of interest having the same spreading code and code phase. Demodulation of the DSSS signal upon reception is accomplished by correlation of the received CDMA signals with a replica of the spreading code used in the transmitter to despread the CDMA signal and hence despread only one of the superimposed DSSS signals, that is, the desired DSSS signal of interest containing the particular spreading code signal to isolate the desired digital data stream. The transmitted spreading code and the identical despreading code enable the spreading, superpositioning, and despreading isolation of many DSSS signals within a CDMA channel bandwidth. It is therefore necessary for the receiver to acquire, that is, determine the code phase between an arrived transmitted spreading code and the receiver locally generated despreading code, in order to isolate by correlation a particular DSSS signal upon reception.

The DSSS receiver is required to determine code phase for DSSS signal acquisition. After the spreading code is remotely generated within the transmitter and the data stream to be communicated is remotely modulated by the spreading sequence by modulo two summing the spreading code with the data stream, the DSSS signal is then typically transmitted asynchronously to the DSSS receiver. The DSSS receiver locally generates the spreading code as an identical despreading code to demodulate by correlation the DSSS signal. However, and importantly, the arrival time of the remotely generated spreading code will not be in code phase synchronization with locally generated despreading code, and as such will prevent correlation despreading of the DSSS signal. Code phase determination, is in effect, a determination of the amount of time displacement between the arrival of the remotely generated spreading code and the locally generated despreading code, both typically initiating the code sequence at differing arbitrary points in time creating an inherent time differential. By delaying the locally generated spreading code by that time differential, that is, by the code phase amount of time, the received spreading code and the despreading code can be aligned in time for correlation demodulation of the DSSS signal to recover the desired data stream.

Hence, the code phase time shift inherently results from generating the spreading code initiated at one point in time in the transmitter in relation to a receiver using the same despreading code initiated at another point in time. The unsynchronized initiations of the spreading and despreading code, in addition to variable transmission delays, create the time differential, that is, the code phase. The despreading of the DSSS signal will only occur when the reception of the remotely transmitted spreading code is aligned in time in the receiver to the locally generated receiver despreading code, after the code phase has been determined for DSSS acquisition. After code phase acquisition, the output of the correlation function upon reception, ideally, is a constant that, after integration of the correlated signal, can establish a threshold level to determine, that is, detect the presence of the desired DSSS signal, upon which, data stream demodulation is used to recover the actual data bits of the data stream. After code acquisition, code tracking continuously monitors the integration output to keep the system in code phase lock. It is desirable that the time required for code acquisition be small as possible for rapid acquisition of the data bits of the data stream for improved performance.

The code phase is effectively set by the initiation of the contents of the receiver shift register feedback structure at an arbitrary point in time relative to the reception of the transmitted spreading code. The initial state, that is, the contents of the M-stage shift register, is described by a binary fill word, which must be chosen to be a non-zero binary vector of length M chips. An exemplar M stage register is used and may be of any suitable arbitrary length M. The feedback taps are typically selected to ensure that the output direct sequence code, that is, the spreading code, is a maximum-length linear sequence, that is, an m-sequence, having a length m equal to $2^M-1$, although other suitable lengths and spreading codes may be used as long as the sequence has desirable auto-correlation and cross-correlation properties to isolate the DSSS signal. The conventional DSSS method is not restricted to the use of m-sequence spreading codes.

Hence, one fundamental problem with DSSS systems is the time required for code phase determination, that is, code acquisition, based upon the time uncertainly associated with the time of arrival of the transmitted spreading code. The time clock of the transmitters and receivers are typically not in time synchronism, and the transmission delays between the transmitter and receiver may vary over time. Hence, DSSS systems have an inherent time delay associated with signal transmissions, and as such, lack inherent time synchronization between the reception of the transmitted spreading code and the receiver locally generated despreading code. The lack of time synchronization creates a code phase between the received spreading code and the locally generated despreading code. In order to acquire the data stream, the code phase is firstly determined to acquire time synchronization, that is, chip synchronization, between the transmitted spreading code of the transmitted signal and receiver despreading code of the locally generated despreading code in the receiver. Upon code phase determination, the transmitted code of the received spread spectrum signal and the locally generated spreading code are matched in time to despread the DSSS signal by correlation to isolate the data stream of interest to then recover the data bits from the DSSS signal. Conventional DSSS systems have relied upon various methods to solve this fundamental code acquisition problem, that is, the problem of rapidly determining code phase. The code acquisition ensures that the receiver shift register generates the spreading code that exactly matches the spreading code generated in the transmitter, by determining the code phase to compensate for channel delays and a lack of synchronization between the transmitter and receiver. Rapid acquisition of the digital signal is desirable and facilitates improved use of the available bandwidth. Thus, rapid acquisition methods are desirable in DSSS systems. Prior solutions to the code acquisition problem include the load and go method, the sliding correlator method, the time reference method, the collateral short code method, and related variants.

The load and go method for rapid code acquisition has been used to estimate a code phase by estimating a fill word of the plurality of fill words. A plurality of differing fill words can be used to generate the spreading code sequence at respective offset times. The method is an estimate in the presence of corrupted received code chips communicated across a noisy channel providing a low signal to noise ratio. A variety of techniques have been used to derive the fill word estimates. The load and go method can achieve rapid code acquisition but only if the signal to noise ratio is high. The starting point in time or code phase is not known, and hypothesis testing over many sequence code phases may be needed to determine code phase. A local replica of the spreading code is generated during reception using a shift register with the same feedback taps and with one of the plurality of fill words as initial register contents that may be the same initial contents that were used in the transmitter. The receiver assumes that the last M chip set is an error free fill word and loads these M chips into the receiver feedback shift register. The receiver then compares the locally generated chip sequence to subsequently received chips to check the correctness of the assumed fill word. This search method determines the code phase between the transmitted spreading code and the identical locally generated despreading code during the code acquisition process. If the received signal has many chip errors, then the "load and go" process will have to be repeated many times and may not work at all in high noise situations.

The sliding correlator method introduces successive time differentials during the generation of the locally generated despreading code. The local despreading code chips are successively offset by sequential chip shifts of the locally generated despreading code relative to the received spreading code. The locally generated despreading code is successively shifted by typically one half chip time creating successively larger time offsets of the code phase until time synchronization occurs between the received spreading code and the locally generated despreading code, where the number of shifted chips determines the code phase, that is, the accumulative time shift of the received chips. Once the code phase is determined by correlation integration detection, the received signal is despread to demodulate DSSS signal to then produce the digital data stream during signal tracking. One disadvantage of this method is the long acquisition time associated with the successive sequential sliding chip shifts of the sliding correlator. The sliding correlator method is slow when searching in a large epoch time uncertainty situation especially over long code sequences that can last weeks in duration to complete one full sequence. The sliding correlator method can be very slow and typically and disadvantageously also adds significant complexity to the receiver while introducing long delays in acquiring the code phase.

The time reference method for solving the rapid code acquisition problem uses a precise time reference at the receiver to estimate code epoch time. This method may be adapted to use an auxiliary transmitter and receiver to transfer a precise time reference from the transmitter to the receiver. The time reference method disadvantageously requires the use of precise internal and external time references and adds further complexity and limitations to the code acquisition process.

The collateral short code method is yet another method of rapid acquisition which firstly and rapidly determines code phase of a short spreading code that is time referenced to the subject long spreading code for determining the code phase of the long code. The short spreading code is used in conjunction with a time synchronized long spreading code. The collateral short code method disadvantageously acquires a DSSS signal using the short code that is in precise time synchronization to a longer code, such that, the phase code determination of a short code aids in directly determining the code phase of long spreading code modulated by the desired data stream. This method disadvantageously requires the use of dual spreading code systems having predetermined code phase relations between the short and long spreading codes. Such a dual code system can significantly increase both receiver complexity and cost.

Another fundamental problem associated with all communication systems, including DSSS systems, is the noisy communication channels through which the signals are transmitted, communicated, and received. Many communication channels are modeled as additive white Gaussian noise channels. The communication channel may also be subjected to intentional and unintentional interference and multipath distortions. These noisy channels create errors typically modeled as random data bit and code chip errors in both the data stream and chip code sequences, respectively. Many of the code symbols of the spreading code sequence are received in error due to noise. This causes errors in many of the data bits of the digital data stream. Real world code acquisition processes disadvantageously suffer from data and chip error uncertainties, complicating the rapid acquisition process.

Digital communication systems have used convolutional error correction techniques to correct data transmission errors. These convolution techniques typically include a transmitter binary convolution process transmitting redundant code bits convolved with the data bits. An inverse convolutional decoder is used to retrieve the data from the convolved encoded signal through a convolutional decoder using trellis, tree, or sequential search error correcting techniques. Typically, the output of the inverse convolution decoder is subject to transmission errors in the convolved digital code and data bits. The initial state of the decoder, as viewed from any arbitrary point along a data stream, is generally not known. By accumulating relative probabilities of state transitions, a probable state to state transition path can be calculated to estimate the current state, and to then compute data that should have been received to enable the correction of data errors. While convolutional coding methods have been used for data error correction, these convolutional error correcting techniques have disadvantageously not been coupled together with DSSS systems to estimate initial states for code phase determination for rapid acquisitions of a particular DSSS signal. These and other disadvantages are solved or reduced using the invention.

SUMMARY OF THE INVENTION

An object of the invention is to provide a method for rapid acquisition of Direct Sequence Spread Spectrum (DSSS) signals comprising spreading codes of chips.

An object of the invention is to provide a method for rapid acquisition of DSSS signals comprising spreading codes of chips modulating a data stream providing a sequence of symbols.

Another object of the invention is to use a reduced state structure for estimating current states of received chip values for resolving chip uncertainties.

Another object of the invention is to simplify DSSS receivers by providing a means of demodulating data bits without generating a local time synchronized version of the spreading code.

Another object of the invention is to apply convolutional decoding principles to estimate the code phase of a DSSS signal.

Another object of the invention is to apply convolutional decoding to estimate epoch time of a sequence of code chips.

Another object of the invention is to apply convolutional decoding to estimate code phase of a sequence of symbols.

Another object of the invention is to apply convolutional decoding to estimate epoch time of a sequence of code chips.

The present invention is applied to any linear code sequence in which each chip is the modulo two sum of a fixed number of preceding chip. The invention is preferably a rapid acquisition method of rapid acquisition of DSSS signals comprising spreading code chips. This rapid acquisition method is herein referred to as a convolutional despreading method. The use of the method enables rapid demodulation of a data stream of data bits. The transmitter and receiver structure can be adapted to function in both a noisy environment and in the presence of other spreading codes as in a CDMA environment. The transmitter includes a spreading code generator having a feedback shift register having a predetermined number of M stages and taps defining a polynomial equation for generating a particular direct sequence code of code chips which modulate the data stream. The received DSSS signal is firstly received, digitized and fed into a delay register having a predetermined number of stages and tapped outputs. The delay register is preferably an M+1 stage tapped serial bit shift register. The delay register provides outputs as branchwords for implementation of a search algorithm to perfect the convolutional despreading method. The delay register is further defined as a state machine having a reduced state map of less than $2^M$ states. The delay shift register, viewed as a finite state machine, then is modeled to transit only among the reduced number of states. The polynomial equation provides a computational relationship between the states. A metric state processor receives the tapped outputs from the delay shift register, and calculates a state transition metric to provide an estimate of the initial state of the delay shift register, to estimate the code phase and initial states of the reduced state structure. The reduced number of states leads to rapid metric calculation and initial state estimates. The estimate of the initial state defines the actual code phase of the chip sequence of symbols that have been received. The state processor can further provide demodulated data recovered from the received symbol sequence, and can further provide a code epoch time estimate.

In the preferred use of the method, a transmitter generates a DSSS baseband signal comprising a data stream of digital data bits modulated by a spreading code of a sequence of code chips initiated at an arbitrary point in time. Typically, such a transmitter will include a tapped feedback shift register generating the spreading code which modulo two sums with the data bits to spread the data stream over a predetermined bandwidth. An improved DSSS receiver may include channel filtering, but preferably includes an analog to digital means for converting the transmitted DSSS baseband signal into digital type signals that are then fed into the delay register having state outputs fed into the metric state processor that then provides the initial estimates of code phase. The code phase can be used to provide a receiver conventional M stage feedback shift register with initial fill words for regeneration of the despreading code for conventional correlation to acquire the data stream for data recovery. The improved receiver can also operate continuously without the use of a conventional correlation receiver.

The convolutional despreading method reformulates the code acquisition problem into a convolutional decoding problem where the receiver includes a finite state machine having a reduced state set, and a metric state processor operating on the reduced set of states and transitions between those states to provide the estimate of initial code phase. The state processor can implement various convolution searching techniques based upon best path metrics computations, such as, the preferred Virterbi trellis or Fano tree search algorithms that are sequential search algorithms searching for the most likely path through a corresponding reduced state transition structure.

For a DSSS system, rapid estimation of the initial state, and therefore the code phase, reduces the time required to acquire the DSSS signal and achieve successful demodulation of the underlying data while leading to reduced complexity of DSSS receivers. For a hopping system, an analog to digital filter provides successive branchwords that correspond to the respective carrier frequencies, the rapid estimation method rapidly determines the hopping code phase. These and other advantages will become more apparent from the following detailed description of the preferred embodiment.

BRIEF DESCRIPTION OF THE DRAWINGS

FIG. 10A is a transmitted branchword diagram for the four-stage DSSS exemplar system showing the derivation of basic branchword structure.

FIG. 10B is a transmitted branchword diagram for the four-stage DSSS exemplar system showing the origin of branchword constraints.

DETAILED DESCRIPTION OF THE PREFERRED EMBODIMENT

Figure 1:
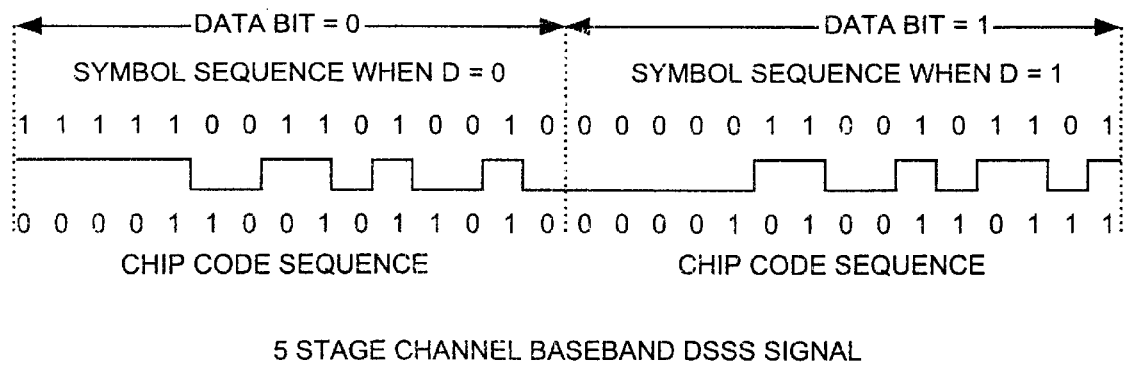
FIG. 1 is a diagram of a sample channel baseband signal of a sequence of code chips modulating data bits into symbols of a five stage Direct Sequence spread spectrum (DSSS) system.

An embodiment of the invention is described with reference to the figures using reference designations as shown in the figures describing an exemplar system. Referring to FIG. 1, a DSSS signal is transmitted as a DSSS baseband signal comprising symbols typically generated by modulating the data bits of the data stream with a sequence of chips of a spreading code from the spreading code generator. The baseband signal symbols assume binary values of zero or one. The baseband signal is transmitted in a conventional manner as symbols of summed bits and chips. The transmission of the baseband signal as a radio frequency signal may be realized by conventional transmitters. The transmission of the spread spectrum digital symbols of summed chips and bits by a carrier modulated radio frequency signals is well known. The communication of the baseband signal may also further include data stream modulation and demodulation, such as, NRZ data modulation and demodulation, and may include carrier modulation and demodulation, such as BPSK carrier modulation and demodulation, both well known but not shown, nor described here.

Figure 2:
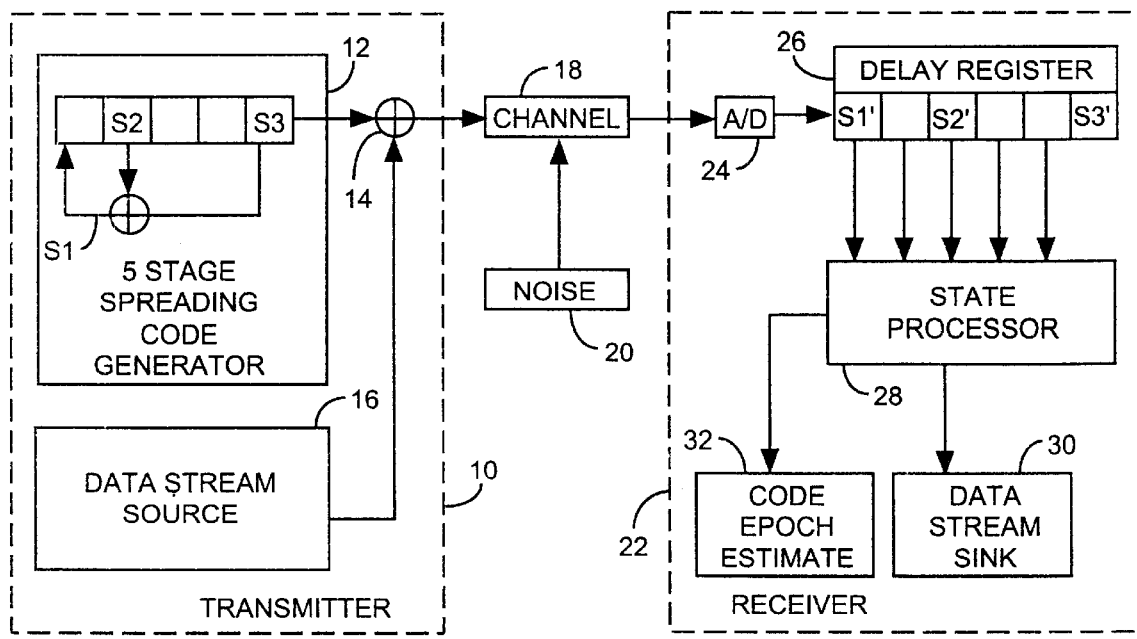
FIG. 2 is a diagram of a five-stage rapid acquisition DSSS system.

Referring to FIGS. 1 and 2, a conventional transmitter 10 includes a transmit code generator 12 and modulo two (+) data modulator 14 for modulating data Dn from a data stream source 16 as a conventional DSSS transmitter 10. The spreading code generator 12 and data modulator 14 are well known. The code generator 12 may be a conventional five-stage feedback shift register structure with taps, such as taps S2 and S3, chosen to provide desirable correlation properties as a direct sequence code generator. The baseband signal may be generated using the transmit code generator 12 configured in the form of the feedback shift register generating the spreading code that is then summed by the modulo two (+) summer 14 with the data bits of a data sequence Dn from a data stream source 16. The modulo two summer 14 provides the DSSS baseband signal with a sequence of symbols.

An exemplar baseband signal when sampled through preferred analog to digital conversion is represented as 111 110 011 010 010 symbols when the data bits equal zero and is inverted to 000 001 100 101 101 symbols when the data bits equal one. The baseband signal is transmitted through a communication channel 18 subjected to noise 20 distortion. The baseband signal is received by a rapid acquisition receiver 22 comprising an analog to digital converter 24, a six stage tapped delay register 26, and a decision metric state processor 28 that provides a received data sequence to a data stream sink 30 and provides code epoch time estimate 32 corresponding to a code phase estimate. The receiver 22 functions as a DSSS signal despreader and data demodulator using the convolutional despreading method within the state processor 28.

At the receiver 22, samples of the noisy received spread spectrum baseband signal are digitized by the A/D converter 24 and clocked into the tapped delay register 26. The time delays between the six delay register stages are chosen to match the chip interval time defined by the chipping rate of the five stage feedback shift register of spreading code generator 12. The received baseband signal may be, for example, sampled once per chip interval although other sampling methods could be employed such as having at least two samples per chip period preferably used in practical implementations. The selected S1', S2' and S3' stages in the receiver delay register 26 are chosen to exactly match the feedback taps S2 and S3 and input S1 of the feedback shift register in the code generator 12.

The spreading code generator 12 provides an output of chips as a direct sequence of chips at the last stage of the code generator 12. After each register shift, the current value of the output chip code sequence Sn is added modulo two (+) to the current value of the data sequence Dn from the data stream source 16 and the resulting baseband signal is then transmitted as a sequence of symbols Xn to the receiver 22 over a channel 18. When the current data bit of the data stream Dn is a zero the spreading code sequence Sn of chips will be transmitted in a noninverted form as symbols Xn. When the current data bit of the data stream Dn is a one, the spreading sequence Sn will be transmitted in an inverted form also as symbols. That is, the transmitted symbol sequence equals the chip code sequence when the current data bit is zero, and the transmitted symbol sequence equals an inverted chip code sequence when the current data bit is a one. Hence, the relationship between the generated chips and the transmitted baseband symbols depends on the current data bit from the data stream generator 16.

The transmitted symbols are successively serially clocked through the delay register 26. The receiver delay register 26 provides stage taps to the state processor 28. Hence, the chip code sequences Sn are clocked out of transmitter spreading code generator 12, summed with the data bits of the data stream source 16 using the modulator 14, and together transmitted as a symbol sequence over the channel 18 to be received by the receiver 22. The symbol sequence is digitized by the A to D converter 24, and successively clocked into the receiver delay register 26 functioning as a serial shifting delay line providing stage taps to the state processor 28. The operation of the state processor 28 scrutinizes these delay register taps under two hypotheses, that is, whether the current data bit was a zero or a one. The transmitted and received symbol sequences under these two hypotheses are inverse chip sequences depending on whether the data bit was a zero or one. The state processor 28 uses a modified search algorithm for estimating code phase and providing demodulated data bits using two disjoint state diagrams with respective disjoint sets of state transitions. The contents of the receiver delay register 26 may be viewed as a branchword. The dimension of these binary branchwords is equal to the number of M stages in the transmitter feedback shift register of the code generator 12, and, is equal to the number of stage taps from the receiver delay line register 26, that is, the five taps of the six stages of the delay register 26 are used in the exemplar form.

The convolutional despreading method is applied to the baseband signal of digital symbols that assume binary values of zero or one. The spreading sequence Sn from the generator 12 is summed by the modulo two (+) summer 14 with data bits Dn from the data stream source 16 to form the sequence of symbols X=S(+)D where D represents the value of the data bit at the current chip time. The exemplar five stage feedback shift register of the code generator 12 is described with feedback taps labeled S2 and S3 at locations two and five. The exemplar five stage code generator 12 does not imply any loss of generality to larger shift registers and corresponding direct code sequences. In the state processor 28, the transmitted spreading code is described as modulo two (+) sums by the polynomial equation S1=S2(+)S3 where S2 and S3 represent the contents of the second and fifth stages, respectively, in the spreading code register of the code generator 12, and correspond to the S1' first stage, S2' third stage and S3' sixth stage of the delay register 26. The S1 input represents the S2(+)S3 summation that will be shifted into the input of the feedback shift register of the code generator 12. This S1 input and two taps, S2 and S3 of the generator 12 correspond to the S1', S2' and S3' stages of the delay register 26 in the receiver 28. The S1', S2' and S3' values along with the untapped chips can be read by the state processor 28 during serial shifting of the delay register 26. The S1, S2 and S3 values are a subset of the five stages of the feedback shift register of the code generator 10. This subset of values corresponds to and can be represented by a reduced system state diagram where the number of S and respective S' values selected for convolutional decoding is less than the number of stages in the feedback shift register of the code generator 12. The convolutional decoding takes advantage of reduced state diagrams and the code sequence polynomial equation.

At the receiver, samples of the noisy received spread baseband signals are clocked into the tapped delay register 26. The register 26 nominally contains six stages but only the first five are actually utilized. The extra stage on the right is shown to clarify the relationship between subsequent branchwords. The delays between the stages of the delay register 26 are chosen to match the chip time interval of the spreading code generator 12. At intervals of every five chips, the contents of the leftmost five stages of the delay register 26 are read by state processor 28. Each set of the five taps from the leftmost five stages of the delay register 26 are a fivetuple word and used as a branchword for convolution decoding. Repeatedly read sequential fivetuples are used as successive branchwords to estimate transitions within the reduced state diagrams for modified convolutional decoding. In a noise free environment, with the current data bit being zero, the values of the S1', S2' and S3' stages in the delay register will correspond exactly to the actual values of S1, S2 and S3 at a previous time, t minus Dt, where Dt corresponds to the total transmission and processing delays in the system. The values S1', S2' and S3' will then conform to the polynomial equation. The state processor utilizes this sequence of fivetuple branchwords to generate an approximate maximum likelihood estimate of both the code phase epoch time and the original data stream sequence D, if present. Hence, the convolutional decoding, that is, despreading of the DSSS signal, is based on the calculation of a best path through a reduced state space where best path is determined by a cumulative path metric computation. The convolutional decoding method is a modified form of the convolutional decoding methods utilized in conventional convolutional decoder and hence are used to achieve the near optimality of maximum likelihood estimators.

The convolutional despreading method relies upon a search algorithm that searches for the best path within the reduced state space. The best path determination provides an estimate of an initial state from which code phase is directly determined. There are many possible search algorithms available for convolutional despreading within the state processor 28. One such algorithm is the exemplar sequential tree search method, which is a modified Fano tree search algorithm. Other search methods based on a trellis search method can be used as well. All implementations will rely on a search of the same reduced state space and also will utilize metrics constructed in a similar manner as the exemplar sequential tree search implementation. The implementation relies upon the construction of the reduced state space and analysis of transitions in that space in view of the governing polynomial equation, epoch time uncertainties and symbol value uncertainties. All such search algorithms provide similar levels of system performance in the presence of a given level of signal-to-noise ratio. The methods differ primarily in computational efficiency.

Each member state of the reduced state space in the exemplar configuration consists of a specific set of three symbol values {S1',S2',S3'}. Each symbol value must be either a zero or one, and hence, there are only eight possible states. When the data bit is zero, the original spreading sequence is modulated and transmitted as symbols in a noninverted form, that is, the symbol sequence is equal to the original chip code sequence. As a result, the valid members of the set of possible states must satisfy the polynomial equation. For the polynomial equation to apply the symbol values, a valid state must include an even number of ones. Thus, the only possible states when the transmitted data bits are zero (D=0), are {S1',S2',S3'}: {0,0,0}; {1,1,0}; {0,1,1}; and {1,0,1}. In contrast, when the transmitted data bit at the transmitter is a one (D=1), the valid states must contain an odd number of ones and are an inverse set, that is, the valid states are {S1',S2',S3'}: {1,1,1}; {0,0,1}; {1,0,0}; {0,1,0}. The entire state space structure can thus be partitioned into two disjoint subspace structures.

As long as the current data bit D=0, the only allowed state transitions are restricted to be between the states {S1',S2',S3'}: {0,0,0}; {1,1,0}; {0,1,1}; and {1,0,1}. Similarly, as long as current data bit D=1, the only allowed state transitions are between the states are {S1',S2',S3'}: {1,1,1}; {0,0,1}; {1,0,0}; {0,1,0}. This separation of the possible set of reduced states into the disjoint subsets is a general condition as long as the spreading sequence generator has an even number of feedback taps. Preferably, the number of spreading chips per data bit is an integer multiple of the spreading code shift register size. However, the convolutional despreading method can function even when the number of spreading chips per data bit is not an integer multiple of the spreading code shift register size provided that the number of chips per bit is not extremely small.

Figure 3:
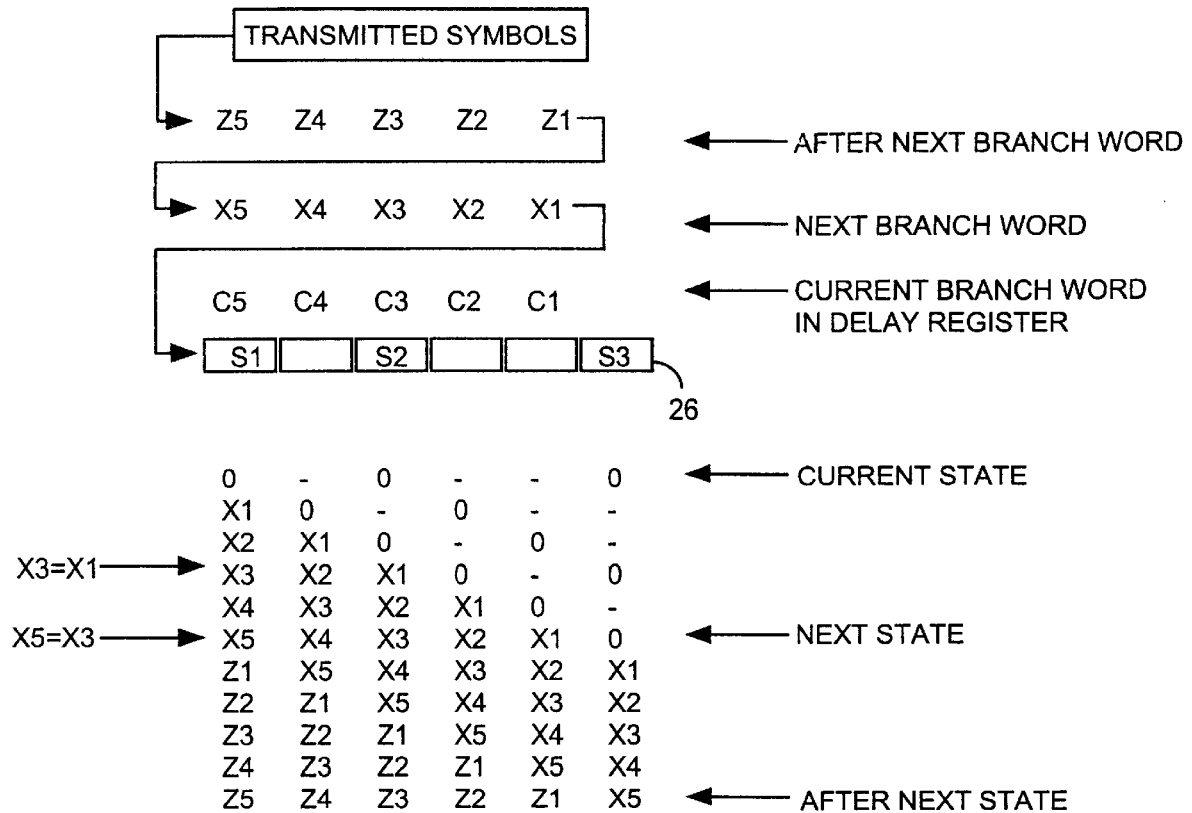
FIG. 3 is a transmitted branchword diagram for the five-stage DSSS system.

Referring to FIG. 3, contents of the tapped delay register 26 is shown as a sequence of received transmitted symbols C1, C2, C3, C4, C5, X1, X2, X3, X4, X5, Z1, Z2, Z3, Z4 and Z5. The symbols are received in sequence and are translated into fivetuple branchwords when shifted through the delay register 26. The current branch is designated {C1,C2,C3, C4,C5}, the next branch is designated {X1,X2,X3,X4,X5}, and the after next branchword is designated as {Z1,Z2,Z3, Z4,Z5}. The transmitted symbols sequence are grouped by fivetuples into successive branchwords communicated to the state processor, one fivetuple branchword every five chip intervals. The convolution despreading emulates a set of state transitions that begin in state {0,0,0}. Each stage of the register 26 corresponds to a vertical column, as shown, of received symbols at each chip time interval. After five time interval, a new fivetuple branchword is read by the state processor. As shown, the contents of tapped delay register are initially set at the {0,0,0} initial state.

Figure 4:
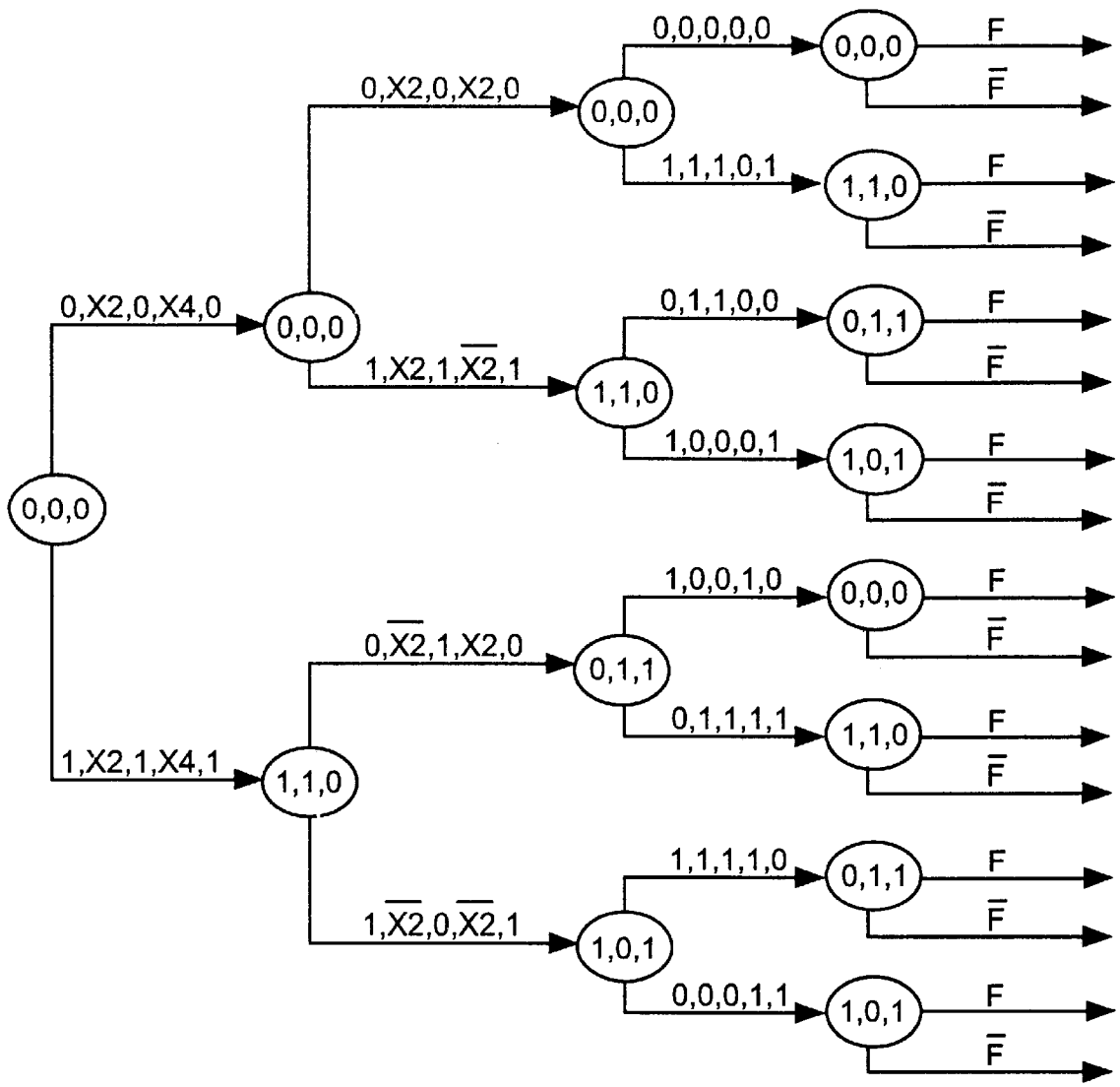
FIG. 4 is a state {0,0,0} tree diagram for the five-stage DSSS system for use with a modified Fano Tree convolutional search.

Referring to FIG. 4, a state {0,0,0} tree diagram shows allowed transitions from an initial {0,0,0} state for first three transitions. The tree diagram shows the allowed transitions out of initial state {0,0,0}. The fivetuple annotations on the transitions between threetuple states correspond to restrictions on the branchwords associated with each allowed transition between {S1,S2,S3} threetuple states. Two allowed transitions from initial state {0,0,0} are shown, the {0,X2,0,X4,0} transition to a first transition state {0,0,0} and the {1,X2,1,X4,1} transition to a first transition state {1,1,0}. The tree diagram shows the transition from the initial state, to two first-level transition states, then to four second-level transition states and then to eight third-level transition states. The tree diagram can be expanded to many more transition levels, K, but after K=three transition levels the tree stops branching. This is a general occurrence at a depth dependent on the details of any specific example.

Referring to FIGS. 3 and 4, the rows of shifted fivetuples shows that because S2 of the original state is zero, the polynomial equation requires that X3=X1(+)0, that is, X3=X1. The polynomial equation also requires that X5=X3 because S1 of the original state is also zero. The branchword {X1,X2,X3,X4,X5} associated with the transition to the next state corresponds to the received symbols X1, X2, X3, X4 and X5. The polynomial equation requires that three of these symbols all be identically 0 or identically 1. Additionally, in general, the last symbol of the next state is always identical to the first symbol of the previous state, that is, the nth state of the system can be expressed by a system equation S3(n)=S1(n−1).

Figure 5A:
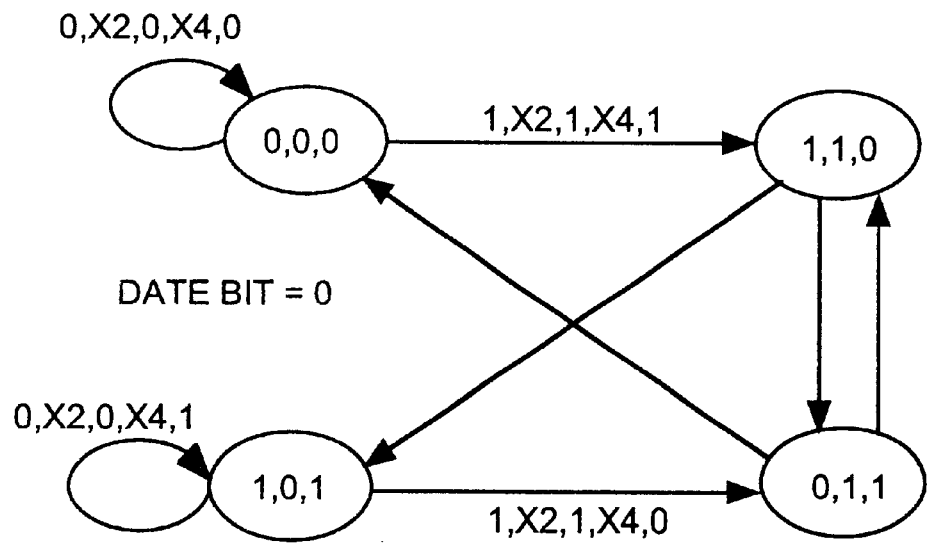
FIG. 5A is a reduced state diagram for when a data bit equals zero for the five-stage DSSS system.
Figure 5B:
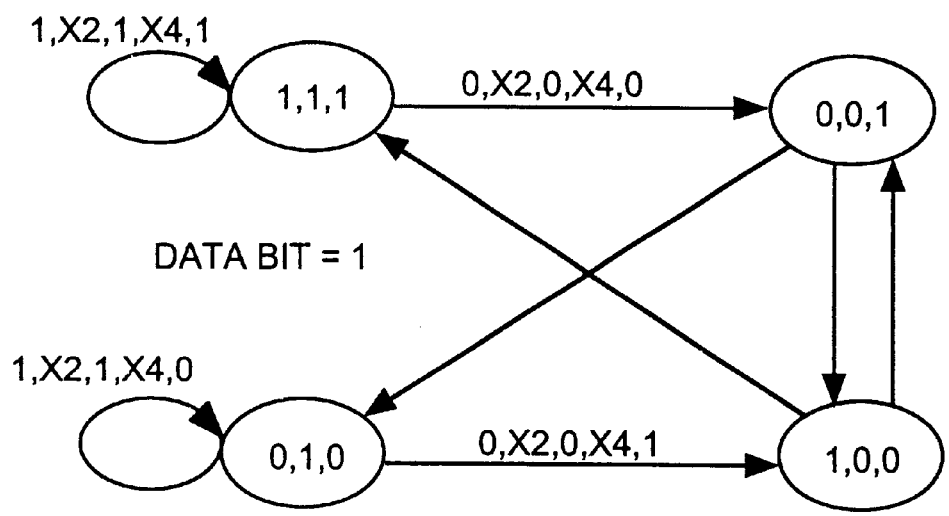
FIG. 5B is a reduced state diagram for when a data bit equals one for the five-stage DSSS system.

Referring to FIGS. 5A and 5B, the exemplar five stage feedback shift register code generator provides two reduced state diagrams for when the data bit D=0, and when the data bit D=1. As shown, the reduced state diagrams are inverted forms. The reduced state diagrams are defined by the polynomial equation. The state space diagrams are used to define and construct either trellis diagrams or tree diagrams, for the two data bit D=0 and D=1 conditions for any initial state. From either type of these diagrams, a selected search algorithm can be applied to all of the initial state tree diagrams. Hence, the reduced state diagrams define all of the possible but necessary initial state diagrams, such as the initial {0,0,0} state tree diagram shown in FIG. 4.

Referring to all of the FIGS. 1 through 5B, and more particularly to FIGS. 3 and 4, when the system equation is applied to the only possible branchwords allowed for a transition out of the {0,0,0} state, the transition must be of the forms of either {0,X2,0,X4,0} or {1,X2,1,X4,1} leading to the conclusion that the only possible next states are {0,0,0} and {1,1,0} with the associated possible branchwords. By applying the polynomial equation to the rows of shifted symbols in extended form to subsequent state transitions, the fully populated tree structure shown in FIG. 4 can be constructed. As shown, only one branch emanates from the states after the third level of transitions. Only one branch emanates from the states by the third level in the tree because all ambiguities have been removed once this third transition level has been reached. Once all ambiguities have been resolved, the code phase can be determined and a fill word can be uniquely identified. Once a correct fill word is known, the set of future branchwords and hence the subsequent states are uniquely determined as well as the sequence of chips. Applying a similar method, state transition trees can be constructed for all other initial states.

The process of constructing the tree representation of the reduced state space is readily generalized to arbitrary spreading codes. For codes, such as a code from a ten-stage feedback shift register, with only two feedback taps, the process is essentially identical to that of the exemplar five-stage feedback shift register, because both provide a similar polynomial equation. For longer codes with more than two taps the algebraic relationships between the sequence of state transitions become more complex but the process is essentially the same. In general, the upper bound on the number of state transitions required to remove all uncertainties in the branchwords is equal to M−2 where M is the register length of the spreading code. As the number of feedback taps increases beyond the minimum value of two, the number of required state transmissions to remove all uncertainties decreases monotonically.

The generation of the code sequence and the generation of data bits in the transmitter are independent processes enabling the use of existing transmitters. The code generator generates a pseudo random spreading code while the data stream source provides an effectively random data bit stream. The determination of the code phase flows from state estimates of the symbols that follows the inverted or non-inverted chip sequence in the same but inverted manner based on the current random modulated data bit. As long as the number of chips per bit is much larger than the register size, M, then, within each bit time, a plurality of branchwords can provide sufficient history to estimate the initial states of one of the two D=0 or D=1 state space. Even if this condition is not true, it is not necessary to actually construct a mirror state space for both conditions when data bit D=1 and when the data bit D=0 because the reduced states are related. The state processor need only consider the two possible alternatives for two data bit conditions D=0 and D=1. These initial state estimates can be separated because the two sets of possible states are related by a one to one mapping with simple inversion of each of the possible valid branchwords shown in the tree diagrams. Thus, a transition between {0,0,0} and {1,1,0} with D=0 is essentially the same as a transition between {1,1,1} and {0,0,1} with D=1 with the associated branchwords simply inverted.

Tree search algorithms refer to the states in the tree as nodes. There are a variety of tree search algorithms that can be used to search all of the tree nodes for the best path. The tree search algorithms are based on the construction of a path metric. The state processor constructs a tree diagram for each possible initial state having locally constructed state space branchwords based upon the polynomial equation. The state processor compares the constructed branchwords of all possible paths with those branchwords that are actually received to create a path metric for each possible path. The metric for each particular path is a measure of how similar the locally generated state space branchwords through a particular path in the tree state space diagrams are with the noise corrupted received branchwords. Mathematically, the correct metric for a soft decision process is the sum of the Euclidean distances between each path branchword received and each constructed path branchword of the tree. Thus, the best path would be that path with the smallest path metric. Convolutional decoders have used correlation or dot product metric computations, and metric computations are well known.

Possible branchwords leaving a state always include inverted pairs with resulting dot products that are of opposite sign. The use of the dot product can reduce the amount of computation required to determine the best path metric. The dot product method is a correlation metric computation. The best path corresponds to the path with the largest metric when using a correlation metric computation, whereas, the best path corresponds to the path with the least metric when using a Euclidean metric computation. In the exemplar five-stage feedback shift register, the path metric W may be defined by the following branch matrix equation where the Z's are the received branchwords and the U's are the constructed branchwords associated with the transitions of a particular path of the reduced state space. K is the number of transition levels that have been searched at any time and M is the number of stages in the shift register. In actual implementation, the use of the correlation metric requires that the symbol values of zero be replaced by negative ones.

BRANCH METRIC EQUATION $$W = \sum_{k=1}^{K} \sum_{m=1}^{M} Z_{k,m} U_{k,m}$$

One specific sequential tree search algorithm is the Fano tree search algorithm. A sequential tree search searches along a path until it is determined that a wrong choice has been made at a node, the algorithm then steps back, and then searches along another path. The Fano algorithm has the advantage of combining an adaptive threshold that controls the search with a specific algorithmic structure that minimizes the amount of memory required to conduct the search by eliminating the need to maintain a list of previously visited nodes. When a preferred correlation based metric is used, the Fano search algorithm is adapted to search for the path with the greatest metric, rather than the smallest metric. However, to use the Fano algorithm in a state processor, three Fano search modifications are required to support the simultaneous search through the two mirror subspaces. The details of the unmodified Fano algorithm are well known by those skilled in the art of convolutional decoding.

The first Fano search algorithm modification is based on the observation that the branchwords associated with each equivalent transition in the two subspaces are inverted pairs. Thus, instead of maintaining a path that can jump from one subspace to the other when the data changes from 1 to 0 or 0 to 1, it is only necessary to maintain a single set of states with a double set of inverted branchwords between each pair of states. As each possible state transition is reached for the first time, the alternative hypotheses of D=0 and D=1 are checked against the received branchword. The best of these pairs is then compared against the best possible choice from all other transitions to the next node, that is, the next state, and the best of all of these is then chosen for the next forward search node.

The second Fano search algorithm modification required to support the metric process search is the use of an assumed known data bit duration to inhibit unrealistic rapid changes in the sense of the current decoded data bit. This is implemented with an algorithm that estimates the epoch of bit transitions thus determining an estimate of bit synchronization and uses this to force local self consistency on a particular path.

Branchwords may be valid or invalid, but in noisy channels, will generally be considered to always be received as at least partially invalid. The third Fano search algorithm modification required to support the metric processor search is the use of constraints such as those shown in FIGS. 3 and 4 along with historical information from a previous transition to determine the best possible next transition. To determine the most probable transition, the transition that most resembles a valid branchword is selected. A received invalid branchword may correlate to a plurality of possible transitions and this third modification minimizes these ambiguities.

With the inclusion of the use of three modifications, the operation of the Fano tree-search exemplar metric processor follows conventional Fano tree-search methods. The first modification supports automatic detection of changes in the modulating data bits as depicted in FIG. 1. The second modification restrains the search algorithm from allowing impossibly fast data bit transitions. The third modification facilitates the inclusion of both recent history and special constraints on the transitions such as those depicted in FIGS. 3 and 4. The operation of this third constraint modification greatly increases the efficiency of the tree-search algorithm.

Referring to FIG. 4, a decision between two alternative paths emanating from a node is made by choosing the path that has the largest correlation with the received branchword. The variables X2 and X4 in the branchwords shown in FIG. 4 represent chip positions that cannot be included in the correlation because of ambiguous values that are also referred to as erasures. However, once a decision has been made regarding the two alternative paths leaving a node, it is possible to look backward to the previous branchword and make decisions regarding some of the chip erasures. At that point, the erased chips can be correlated with the previous branchword and used to help validate the tentative decision between the two alternative paths. Thus, at any node, the decision between alternative paths is based on a metric that has a forward-looking component, and a backward-looking component.

The tree diagram of FIG. 4 shows the node $\{1, 1, 0\}$ at a depth transition level 3 of the tree. When the search algorithm arrives at this node of the tree, it must decide between the upper branch leading to node $\{0, 1, 1\}$ and corresponding to branchword $\{0, 1, 1, 0, 0\}$ or the lower branch leading to node $\{1, 0, 1\}$ and corresponding to branchword $\{1, 0, 0, 0, 1\}$. To make this upper or lower branch decision, the search algorithm computes a correlation between the received branchword and the two possible forward-looking branchwords, and chooses the branch with the largest correlation as the best path. When the upper branch is chosen as the best path based on the forward branchword correlation, the algorithm can now look backward to the branchword entering node $\{1, 1, 0\}$, namely $\{1, X2, 1, X2, 1\}$ and decide what value of X2 would permit the upper branch to be taken out of node $\{1, 1, 0\}$. X2 must be 0 to allow a branch from node $\{1, 1, 0\}$ to node $\{1, 1, 0\}$. Conversely, X2 must be 1 to allow a branch from node $\{1, 1, 0 \text{ to } 1, 0, 1\}$. By looking backward and determining which value of the erased chip X2 best matches the received branchword, an additional term to the metric out of node $\{1, 1, 0\}$ can be computed and added to the path metric. This additional term in the metric supports the upper or lower branch decision above that can be obtained from just the forward-looking correlation.

Figure 6:
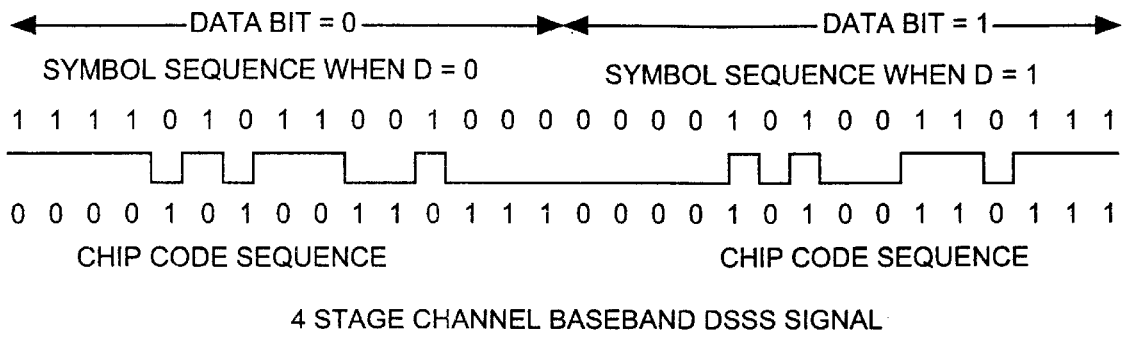
FIG. 6 is a diagram of a sample channel baseband signal of a sequence of code chips modulating data bits into symbols of a four-stage DSSS system.
Figure 7:
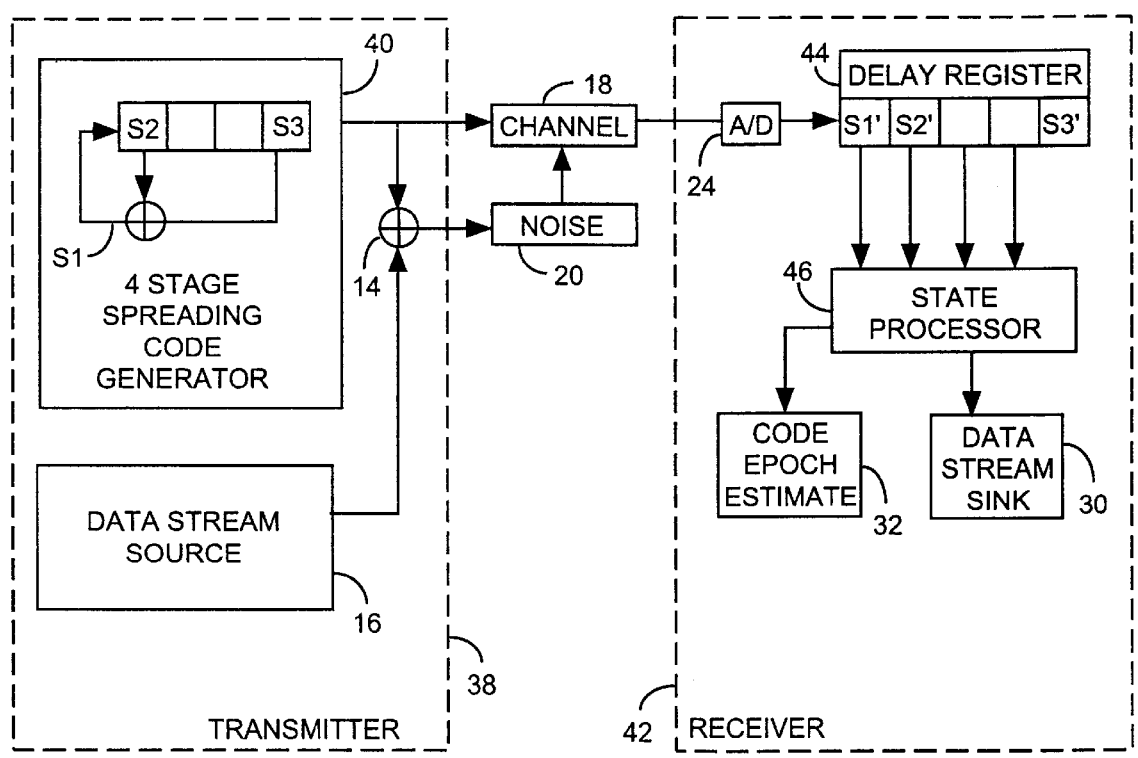
FIG. 7 is a diagram of a four-stage rapid acquisition DSSS system.

Referring to FIGS. 6 and 7, a trellis search exemplar metric processor is described based upon a four stage DSSS system employing a modified trellis convolutional sequential search algorithm. The system includes a four-stage DSSS transmitter 38 having a four-stage spreading code generator 40 configured as a four-stage feedback shift register with taps chosen to provide desirable correlation properties in a four stage DSSS receiver 42. The spreading code sequence can be described by the following four stage polynomial equation S1=S2(+)S3. The trellis search based convolutional despreading method described here again takes advantage of the algebraic structure of the spreading code to avoid the necessity of performing code acquisition.

In a four-stage receiver 42, samples of the noisy received spread spectrum baseband signals are digitized by the digital to analog converter 24 and clocked into a five-stage tapped delay register 44. Again, the delays between the taps of the register 44 are chosen to match the chip interval of the spreading code. The receiver delay register 44 provides taps signals of branchword transition vectors to decision metric state processor 46 implementing a modified trellis convolutional search algorithm again based on hypotheses of whether the data bit is a zero or a one and assumptions about restrictions on state transition branchwords.

Figure 8A:
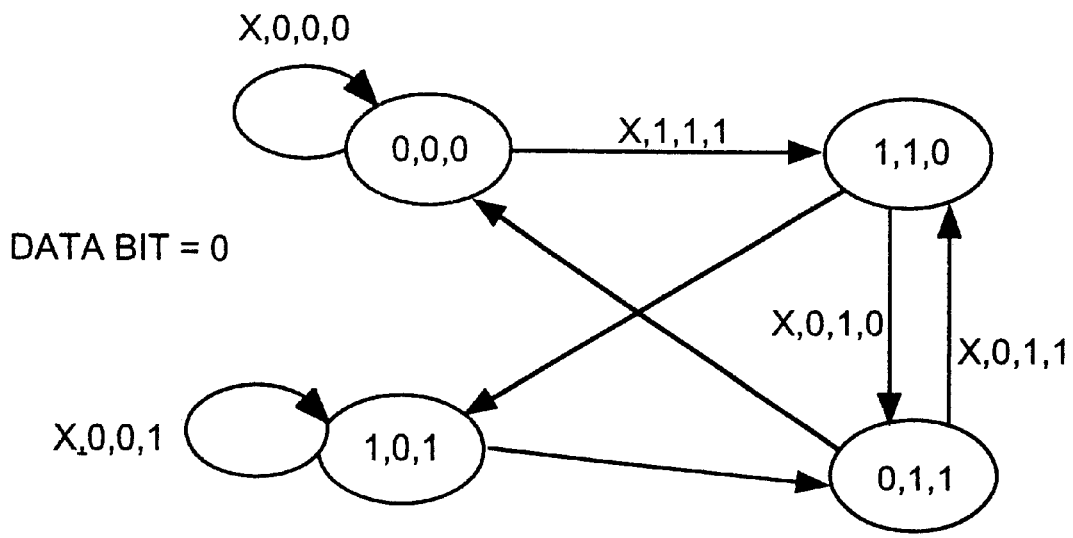
FIG. 8A is a reduced state diagram for when a data bit equals zero for the four-stage DSSS system.
Figure 8B:
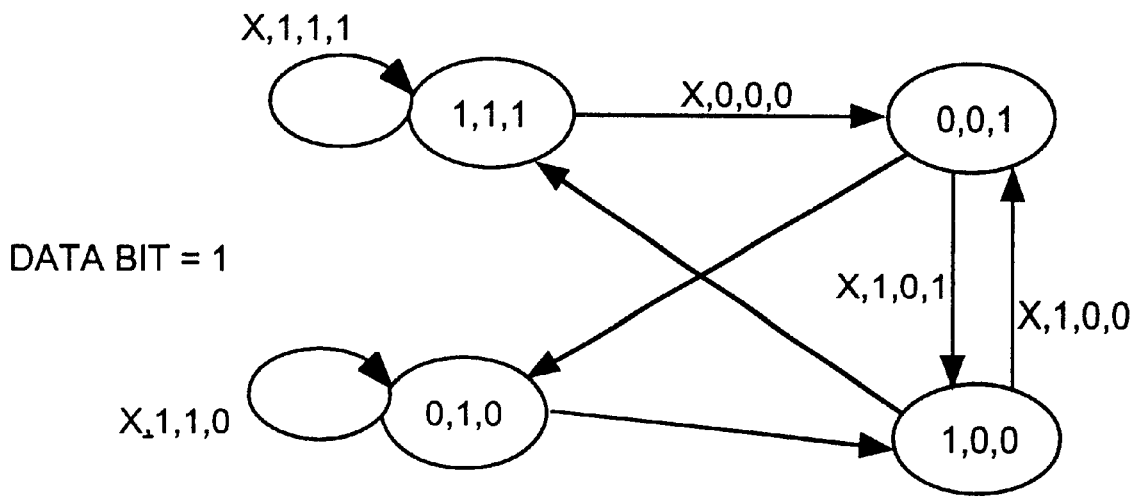
FIG. 8B is a reduced state diagram for when a data bit equals one for the four-stage DSSS system.

Referring to FIGS. 8A and 8B, the received symbols are modeled by two reduced state diagrams for when the data bit equals zero and for when the data bit equals one. Again, the contents of the stages have output taps that fall into one of two disjoint reduced state spaces, depending on the value of the data bit. If the data bit is 0, then the contents of the 3 stages having taps is one of the following state vectors {S1',S2',S3'}: {0,1,1}; {1,0,1}; {1,1,0}; and {0,0,0}. Conversely, if the data bit is a one, the contents of the three stages is one of the following states {S1',S2',S3'}: {0,0,1}; {0,1,0}; {1,0,0}; {1,1,1}. Therefore, the contents of the tapped stages at any chip time is an indication of whether the data bit is zero or a one. By accumulating the information on which data bit value these sets of delay register state vectors is most consistent with, the value of the data bit can be estimated. As before, two disjoint families of three dimensional binary state vectors are constructed. The dimension of three is equal to one plus the number of taps included in the feedback sum in the transmitter shift register. It is always possible to construct these two sets of binary vectors as long as the transmitter four stage shift register has an even number of taps.

Referring to FIG. 8A, the constraints imposed by previous transitions correspond to the relationship of the last transmitted symbol of a particular branchword to the last transmitted symbol of the previous branchword. The symbols in a branchword are listed with the first symbol transmitted, and hence also the first symbol received on the left, while the last symbol to be transmitted, and hence also the last symbol received, on the right. Thus, the branch leaving state {1, 1, 0} and going to state {0, 1, 1} is labeled {X, 0, 1, 0}, that is the symbol transmitted and hence received are X followed by zero, followed by one, followed by zero. Here, X can be either a zero or a one but it may be constrained to be either the same or the opposite of the first symbol associated with the previous transition that leads into state {1, 1, 0}.

Referring to FIGS. 8A and 8B and 10A and 10B, the origin of the particular transition constraints for the M=4 trellis example is considered in view of the specific transition from the state {1, 1, 0} to state {0, 1, 1,}. The symbol by symbol process of this transition is depicted in FIG. 10A. As shown in FIG. 10A, the next state must satisfy the conditions S1=X4=X3, S2=X3 and S3=1. This condition indicates that the only two possible next states are {1, 0, 1} or {0, 1, 1}. When the next state is {0, 1, 1} then the branchword leading to this state from the previous state must be given by the last four received symbols (X1, X2, X3, X4); but, with X4=S1=0 and X3=S2=1 and X2=X3=0, the branchword must be of the form {X1, 0, 1, 0}.

The origin of the specific constraint on X1, is understood by backing up in time and examining the state transition leading into state {1, 1, 0}. When the previous transition originated in state {0, 0, 0}, the previous branchword must have been of the form (W1, 1, 1, 1,). FIG. 10B depicts the situation for the set of transitions from {0, 0, 0} to {1, 1, 0} to {0, 1, 1}. Referring to FIG. 10B, if the first symbol of the previous transition was W1 then the first symbol of the subsequent transition must be W1. As shown in FIG. 10B, the overbars indicate logical inversion.

Construction of a Figure similar to FIG. 10B for the other possible transition into {1, 1, 0} from {0, 1, 1} will completely establish that the (1, 1, 0) to (0, 1, 1) branchword must be of the form shown in FIG. 8A and that the above inversion condition always applies. This same process may be applied to all transitions to establish the complete set of possible branchwords and associated constraints. Although this process is tedious it need only be done once for a specific spreading code and is amenable to applications of automated symbol manipulation tools.

Figure 9A:
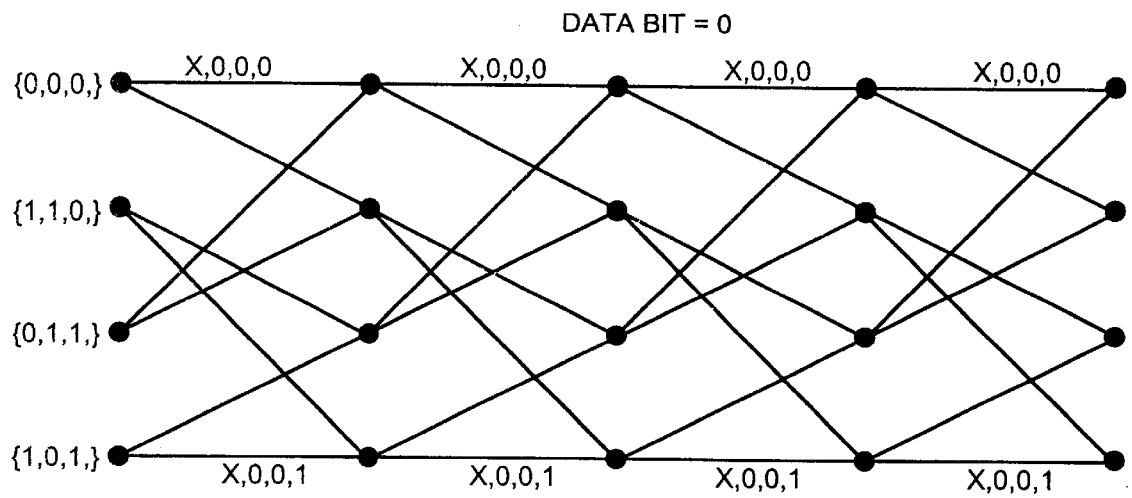
FIG. 9A is a reduced trellis diagram for when a data bit equals zero for the four-stage DSSS system.
Figure 9B:
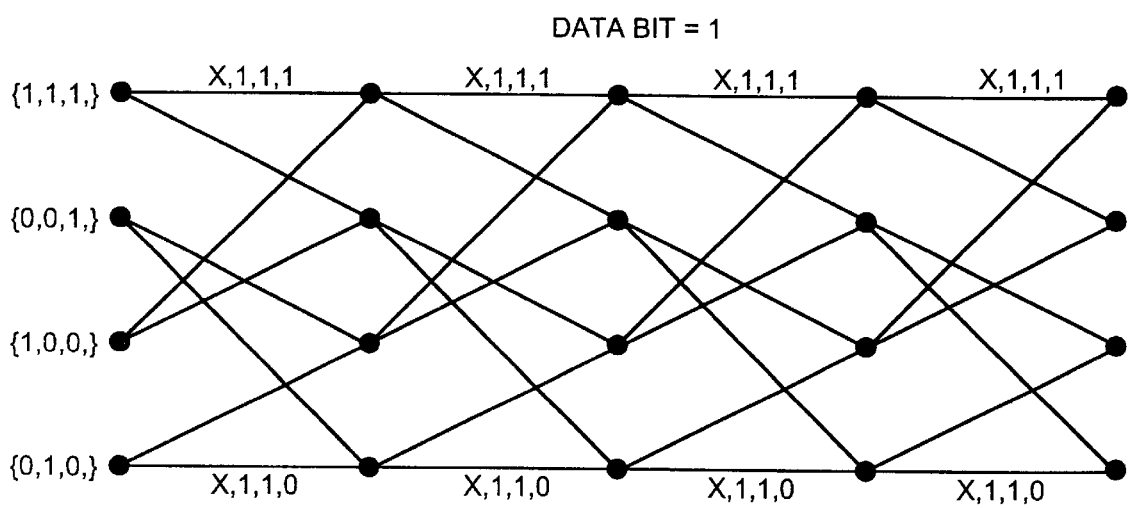
FIG. 9B is a reduced trellis diagram for when a data bit equals one for the four-stage DSSS system.

Referring to FIGS. 9A and 9B, two disjoint reduced state structures are shown by all possible connecting branchwords by a trellis diagram used for computing path metrics. At each chip time, real digitized samples of the received symbols are shifted into the delay register 44. Each set of four new chips forms a new M=4 chip branchword. This branchword is passed to the metric processor 28, to be compared to all possible next branches in the reduced state space. The path metric measure of the best path is taken to be the correlation between the received M vector branchwords and constructed branchwords. If the number of chips per bit is not a multiple of the register size then in the region between when D=0 and D=1 there will be a short transient in which the chip metrics are invalid. This will occur until the contents of the receiver delay register are flushed clear of the chips belonging to the previous bit, at which time correct chip metrics will again be calculated. The trellis search algorithm can be modified to process this condition exactly but this will result in only a small performance gain for cases where the number of chips per bit is large with respect to the register size.

Referring to FIGS. 6 through 9B, the process of computing path metric for the trellis based exemplar system is repeated as each M-tuple set of symbols is received, and the path metrics are accumulated for both hypotheses when the data bit equals zero D=0, and when the data bit equals one D=1, over the data bit interval. The cumulative correlation for the D=0 hypothesis is compared to the D=1 hypothesis. After the branch metrics have been accumulated over a complete data bit interval, the data bit decision is made by choosing the hypothesis with the highest accumulated metric.

The details of operation for the exemplary 4-symbol trellis system follows the general pattern of the Viterbi search algorithm, which considers all possible paths through the trellis diagram. To control the amount of memory required, the algorithm deletes unlikely paths as they are identified. A path is considered unlikely if both it and another path join at the same node and if one of the paths has a worse metric, that is, a lower metric for a correlation type metric, then that path is considered worse and discarded. This process of eliminating unlikely paths in a trellis diagram is well known by those skilled in the art of convolutional decoding. The most significant modification to the standard Viterbi algorithm for this application is the use of two alternative branchwords for each state transition. This process results in a simplified detection of bit transitions and is similar to the double branchword procedure of the 5-symbol modified tree search process.

The convolution despreading method of the state processor will provide differing levels of performance in the presence of differing levels of additive white Gaussian noise. The convolution despreading method may provide options for controlling thresholds and search buffer sizes for purposes of optimizing performance. The convolution despreading method can be implemented on a general purpose microprocessor that can accommodate the chipping rate of the DSSS baseband signal in real time. For very high chipping roles, Application Specific Integrated Circuits will be needed. The convolution despreading method can be programmed to support any arbitrary encoding linear sequence generator, such as the exemplar five-stage feedback shift register of the code generator.

In the absence of data changes, the convolutional despreading method functions in the presence of extremely low signal to noise ratios. Consistent with the conventions of digital communications, the measure of signal to noise employed is energy per chip to noise power spectral density, Ec/No. The exemplar convolution despreading method may use a data buffer of only 400 chips. The performance of the state processor improves with increasing Ec/No of the baseband signal for a given chip buffer size. As the value of Ec/No increases, buffers as small as 100 chips may still function satisfactorily in practical implementations. The computational metric requires a number of passes through the Fano algorithm. The number of passes is roughly proportional to the computational delay required to achieve full synchronization between the received chipping code symbols and the transmitted chipping code symbols. Similar general behavior is observed in the presence of random data transitions and acceptable processing metrics are also observed. Simulation performance of the five bit exemplar DSSS system is consistent with theoretic limits that are determined by the number of chips per data bit.

The convolutional despreading method for estimating the code phase is a recursive algorithm based on a polynomial equation defined by a code generator typically configured as a feedback shift register having taps and feedback input. The convolutional despreading method involves the construction of a search diagram, such as a trellis or tree path diagram, of all possible alternative paths based upon expected branchwords defined by the polynomial equation of the code generator. The trellis search diagram defines all parallel paths carried forward together, whereas a tree diagram examines one path at a time. The purpose of the state processor is to estimate the initial state, and in so doing, estimate the initial state, and hence the current state, and hence code phase as well as determining the code sequence. The initial state estimate is that corresponding to the most probable path through the historical trellis or tree diagram.

The convolution despreading method is characterized by the use of a reduced state diagram applied to direct sequence code generator transmitting inverter or noninverted chip sequences, and characterized by the application of sequential searching algorithms for determining the most probable path through a transition state space defined by that reduced state diagram. Each transition in the state diagram is determined by a branchword of received symbols, and transitional rules implemented by the metric processor limit possible sequences for rapid determination of the best path through a family of initial state tree diagrams as the estimate of the best path from an initial state. After estimating all of the best paths of each possible initial state, the initial state having the best path of all of the best paths of all of the possible initial states is selected as the estimate initial state. The initial state corresponds to a fill word that directly determines code phase epoch time. With a large number of chips per data bit, the code phase can be determined during a single-bit time period in presence of an effectively random-data-stream bit sequence. Having determined code phase, the state processor can then be used to determine the data bits, by virtue of the symbols being either inverted or noninverted, and thereby provide a demodulated data stream to the data stream sink.

The convolution despreading method resolves by estimation initial state uncertainties that are created by noise and arbitrary arrival times. An estimate of the initial state is a result of determining the most probable path through either a tree or a trellis diagram defined by the corresponding reduced-state diagram. The best path defines the best initial estimate of the initial state including the initial fill word. The method causes a transition in the state diagram. The method hypothesizes the initial state, and searches for the best path among all of the paths emanating for the respective tree or trellis diagram for the respective possible initial states. For each transition from the initial state, the state processor compares possible branchwords with the one received and selects the most probable branchword with the best, smallest Euclidean or largest correlation path metric. The state processor estimates the most probable path through the state diagram that necessarily determines the most probable valid branchwords. Once the most probable path of valid branchwords is determined, the initial state is thereby estimated, and the code phase can be directly estimated.

The convolutional despreading method may be used for rapid acquisition of a weak DSSS signal by rapidly determining the code phase of a large pilot DSSS signal that is in code phase offset from many superimposed weak DSSS signals. In practice, some communication systems in which a high Ec/No pilot spreading code baseband signal is transmitted without modulating any data, the metric processor can estimate code phase, without demodulating any data. This code phase estimate can then be translated by time reference to the code phase of other synchronized spreading codes used by conventional correlation despreaders despreading DSSS baseband signals having very low Ec/No power spectral density. Hence, such a receiver rapidly determines code phase of the pilot DSSS signal, thereby rapidly determining the code phase of any number of time synchronized spreading codes of other DSSS signals, enabling rapid acquisition of any time synchronized DSSS signal.

The convolutional despreading method may be used for the rapid acquisition of frequency hopped spread spectrum signals. Frequency hopped spread spectrum systems transmit a signal at frequencies that change at fixed time intervals determined at each time interval by the current contents of an M chip feedback shift register that are used to control a digital frequency synthesizer for generating hopped frequency, as is well known by those skilled in the art of spread spectrum systems. For such frequency hopped signals, the analog to digital converter 24 in FIG. 7 would comprise a bank of filters for providing respective branchwords. Each filter would have a center frequency corresponding to a specific branchword consisting of a set of M chips. Thus, the sequence of received tones is converted to a sequence of received M chip branchwords. This sequence of branchwords can then be used as input to the metric processor and the output of the metric processor can be used to determine the hopping code phase. Either of the tree or trellis search algorithms could be used by the metric processor in a frequency hopped receiver.

The convolutional despreading method can be applied to a wide range of systems in which code phase determination is desirable. This invention can be used in a CDMA application to isolate and demodulate individual CDMA signals without the need of a pilot signal or other acquisition aids. The preferred embodiments were directed to relatively simple code generators based upon corresponding simple polynomial equations, but the method may be readily expanded to cover more complex code generators. The invention in the broadest form convolutionally determines code phase of a code irrespective of any data modulation or spectrum spreading.

Those skilled in the art can make enhancements, improvements and modifications to the invention. However, those enhancements, improvements and modifications may nonetheless fall within the spirit and scope of the following claims.

What is claimed is:

1. A method for estimating a code phase of a linear code defined by a polynomial, generating the linear code by sequential shifting a code generator of M stages, the method comprising the steps, constructing a reduced state space by mapping the M stages into M-tuple length possible branchwords and by mapping the M-tuple length possible branchwords into transitions of the reduced state space of possible states each of N length defining N-tuple states conforming to the polynomial where N is less than M and where the possible branchwords define possible paths through the reduced state space extending from initial states through intermediate states to ending states, transmitting the linear code as transmitted symbols, receiving the transmitted symbols as received symbols received arbitrarily in time establishing the code phase relative in time, grouping the received symbols into received branchwords of M length, computing path metrics for the possible paths by searching from the initial states through the intermediate states to the ending states of the possible states within the reduced state space by metric comparison of the possible branchwords with the received branchwords, and estimating the code phase by selecting within the reduced state space one of the initial states having a preferred path of the possible paths to one of the ending states, which preferred path corresponds to a best metric of the computed path metrics.

2. The method of claim 1 wherein, the code generator is an M stage feedback shift register having an input equated by the polynomial to one or more taps of the M stages, and the polynomial is an equation defining the linear code and equating the input to the taps of the M stages.

3. The method of claim 1 wherein, the code generator is an M stage feedback shift register having an input to the M stages where the input is equated by the polynomial to N−1 taps of the M stages, the polynomial is an equation defining the code sequence, and the input and N−1 taps define N-tuple states of the reduced state space.

4. The method of claim 1 wherein, the code generator is an M stage feedback shift register having an input to the M stages where the input is equated by the polynomial to N−1 taps of the M stages, the polynomial is an equation defining the linear code, the input and N−1 taps define the N-tuple states of the reduced state space, the polynomial provides an equation relationship between the input and the N−1 taps, and the equation relationship limits the number of the possible paths between states to constrain the searching to limit the number of the possible paths upon which the path metrics are computed.

5. The method of claim 1 wherein the linear code is a sequence of code chips, the method further comprising the steps of modulating a data stream of data bits by combining the sequence of code chips with the data bits.

6. The method of claim 1 wherein the linear code is a sequence of code chips, the method further comprising the steps of generating the code chips at a chipping rate, generating a data stream of data bits at a data rate lower than the chipping rate at a multiple of the data rate, modulating the data stream of data bits by modulo two summing of the code chips with data bits to spectrum spread the data stream of data bits each into a plurality of the transmitted symbols.

7. The method of claim 1 wherein the linear code is a series of code chips having a code length equal to (two to the power of M) minus 1, the method further comprising the steps of modulating a data stream of data bits by combining the series of code chips with the data bits.

8. The method of claim 1 further comprising the steps of, setting a metric threshold value, determining when the computed path metrics are higher than the metric threshold value, and terminating the searching along one of the possible paths when a respective one of the path metrics exceeds the metric threshold value to constrain the search to limit to metric.

9. The method of claim 1 further comprising the steps of, setting a metric threshold value, determining when the computed path metrics are higher or lower than the metric threshold value by a predetermined metric adaptive value, resetting adaptively the metric threshold value higher or lower when the computed path metrics are respectively higher or lower than the metric threshold value by the predetermined metric adaptive value, and terminating the searching along one of the possible paths when a respective one of the path metrics exceeds the metric threshold value to constrain the searching to limit metric computation.

10. The method of claim 1 wherein the computing step the possible states and possible paths are defined by a trellis transition diagram.

11. The method of claim 1 wherein the computing step, the possible states and possible paths are defined by a tree diagram.

12. A method for estimating a code phase of a direct sequence code defined by a polynomial, generating the direct sequence code by sequential shifting a code generator of M stages, the method comprising the steps, constructing a reduced state space by mapping the M stages into M-tuple length possible branchwords and by mapping the M-tuple length possible branchwords into transitions of the reduced state space of possible states each of N length defining N-tuple states conforming to the polynomial where N is less than M and where the possible branchwords define possible paths through the reduced state space extending from initial states through intermediate states to ending states, generating the direct sequence code as a sequence of code chips at a chipping rate by the code generator comprising an M stage feedback shift register having an input to the M stages where the input is equated by the polynomial to N−1 taps of the M stages, the polynomial is an equation defining the direct sequence code sequence, the input and N−1 taps define the N-tuple states of the reduced state space, the polynomial provides an equation relationship between the input and the N−1 taps, generating a data stream of data bits at a data rate lower than the chipping rate at a multiple of the data rate, modulating the data stream of data bits by modulo two summing of the code chips with data bits to spectrum spread the data stream of data bits each into a plurality of symbols, transmitting the plurality of symbols as a sequence of transmitted symbols, receiving the transmitted symbols as received symbols arbitrarily in time establishing the code phase relative in time, grouping the received symbols into received branchwords of M length, computing path metrics for the possible paths by searching from the initial states through the intermediate states to the ending states of the possible states within the reduced state space by metric comparison of the possible branchwords with the received branchwords, the equation relationship limits the number of the possible paths between the N-tuple states to constrain the searching to limit the number of the possible paths upon which the path metrics are computed, and estimating the code phase by selecting within the reduced state space one of the initial states having a preferred path of the possible paths to one of the ending states, which preferred path corresponds to a best metric of the computed path metrics.

13. The method of claim 12 further comprising the steps of setting a metric threshold value, determining when the computed path metrics are higher than the metric threshold value, and terminating the searching along one of the possible paths when a respective one of the path metrics exceeds the metric threshold value to constrain the searching to limit metric computation.

14. The method of claim 12 further comprising the steps of, setting a metric threshold value, determining when the computed path metrics are higher or lower than the metric threshold value by a predetermined metric adaptive value, resetting adaptively the metric threshold value higher or lower when the computed path metrics are respectively higher or lower than the metric threshold value by the predetermined metric adaptive value, and terminating searching along one of the possible paths when a respective one of the path metrics exceeds the metric threshold value to constrain the searching to limit metric computation.

15. The method of claim 12 wherein, the data stream is a static data stream so that the sequence of code chips are unmodulated by the data stream, the received symbols are an unmodulated pilot tone sequence of code chip symbols, and the code phase is a pilot code phase and the code phase determination is a pilot code phase determination of the pilot code phase of the pilot tone sequence of code chip symbols, the method further comprising the steps of, demodulating a second sequence of transmitted symbols having a second code phase displaced from the pilot code phase.

16. A method for estimating the code phase of a code defined by a polynomial derived from M stages of a code generator providing the code, the method comprising the steps, constructing a reduced state space by mapping the M stages into M-tuple length possible branchwords and by mapping the M-tuple length possible branchwords into transitions of the reduced state space of possible states each of N length defining N-tuple states conforming to the polynomial where N is less than M and where the possible branchwords define possible paths through the reduced state space extending from initial states through intermediate states to ending states, generating the code as a sequence of code chips at a hopping rate by the code generator comprising an M stage feedback shift register having an input to the M stage where the input is equated by the polynomial to N−1 taps of the M stages, the polynomial is an equation defining the code, the input and N−1 taps define N-tuple states of the reduced state space, the polynomial provides an equation relationship between the input and the N−1 taps, frequency hopping a carrier signal, the hopping being between a plurality of frequencies respectively corresponding to the possible states, modulating the carrier with a data stream of data bits as a modulated carrier signal, transmitting the modulated carrier signal receiving the modulated carrier signal, generating a plurality of branchwords respectively corresponding to the plurality of frequencies, the modulated carrier signal arriving arbitrarily in time establishing the code phase relative in time, computing path metrics for the possible paths by searching from the initial states through the intermediate states to the ending states of the possible states within the reduced-state space by metric comparison of the possible branchwords with the received branchwords, the equation relationship limits the number of possible paths between states to constrain the sequential search by limiting the number of possible paths upon which the path metrics are computed, and estimating the code phase by selecting within the reduced-state space one of the initial states having a preferred path of the possible paths to one of the ending states, which preferred path corresponds to a best metric of the computed path metrics.

* * * * *